(12) United States Patent
Todorow et al.

(10) Patent No.: US 10,825,708 B2
(45) Date of Patent: Nov. 3, 2020

(54) PROCESS KIT COMPONENTS FOR USE WITH AN EXTENDED AND INDEPENDENT RF POWERED CATHODE SUBSTRATE FOR EXTREME EDGE TUNABILITY

(71) Applicant: APPLIED MATERIALS, INC., Santa Clara, CA (US)

(72) Inventors: Valentin Todorow, Palo Alto, CA (US); Samer Banna, San Jose, CA (US); Imad Yousif, San Jose, CA (US); Albert Wang, Concord, CA (US); Gary Leray, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 997 days.

(21) Appl. No.: 13/651,354

(22) Filed: Oct. 12, 2012

(65) Prior Publication Data

US 2013/0154175 A1 Jun. 20, 2013

Related U.S. Application Data

(60) Provisional application No. 61/576,324, filed on Dec. 15, 2011, provisional application No. 61/691,077, filed on Aug. 20, 2012.

(51) Int. Cl.
*H01L 21/683* (2006.01)
*H01J 37/32* (2006.01)
*H02N 13/00* (2006.01)

(52) U.S. Cl.
CPC .... *H01L 21/6833* (2013.01); *H01J 37/32642* (2013.01); *H01J 37/32715* (2013.01);
(Continued)

(58) Field of Classification Search
CPC .............. H01L 21/6833; H01L 21/6831; H01J 37/32642; H01J 37/32715; H02N 13/00; Y10T 279/23
(Continued)

(56) References Cited

U.S. PATENT DOCUMENTS 5,103,367 A    4/1992  Horwitz et al.
5,728,254 A *  3/1998  Jeng .......................... 156/345.51
(Continued)

FOREIGN PATENT DOCUMENTS

CN           1745463 A      3/2006
EP         0 520 519 A1    12/1991
WO     WO 2007/019049 A2   2/2007

OTHER PUBLICATIONS

International Search Report and Written Opinion dated Mar. 29, 2013 for PCT Application No. PCT/US2012/060314.
(Continued)

*Primary Examiner* — David P Bryant
*Assistant Examiner* — Nirvana Deonauth
(74) *Attorney, Agent, or Firm* — Moser Taboada

(57) ABSTRACT

Process kit components for use with a substrate support of a process chamber are provided herein. In some embodiments, a process kit ring may include a ring shaped body having an outer edge, an inner edge, a top surface and a bottom, wherein the outer edge has a diameter of about 12.473 inches to about 12.479 inches and the inner edge has a diameter of about 11.726 inches to about 11.728 inches, and wherein the ring shaped body has a height of about 0.116 to about 0.118 inches; and a plurality of protrusions disposed on the top surface of the ring shaped body, each of the plurality of protrusions disposed symmetrically about the ring shaped body.

16 Claims, 8 Drawing Sheets

(52) U.S. Cl.
CPC ......... *H02N 13/00* (2013.01); *H01L 21/6831* (2013.01); *Y10T 279/23* (2015.01)

(58) Field of Classification Search
USPC ........................................................ 269/315
See application file for complete search history.

(56) References Cited

U.S. PATENT DOCUMENTS

| | | | |
|---|---|---|---|
| 6,039,836 | A | 3/2000 | Dhindsa et al. |
| 6,149,730 | A | 11/2000 | Matsubara et al. |
| 6,232,236 | B1 | 5/2001 | Shan et al. |
| 8,211,324 | B2 | 7/2012 | Dhinsa et al. |
| 8,734,664 | B2 | 5/2014 | Yang et al. |
| 8,988,848 | B2 | 3/2015 | Todorow et al. |
| 2002/0004309 | A1 | 1/2002 | Collins et al. |
| 2002/0139478 | A1 | 10/2002 | Ma et al. |
| 2003/0013315 | A1 | 1/2003 | Park et al. |
| 2003/0037880 | A1 | 2/2003 | Carducci et al. |
| 2007/0032081 | A1 | 2/2007 | Chang et al. |
| 2008/0289766 | A1* | 11/2008 | Heemstra .......... H01J 37/32623 156/345.51 |
| 2009/0179365 | A1 | 7/2009 | Lerner et al. |
| 2009/0285998 | A1 | 11/2009 | Okumura et al. |
| 2010/0059181 | A1 | 3/2010 | Lee et al. |
| 2010/0326601 | A1 | 12/2010 | Koshiishi et al. |
| 2011/0094994 | A1 | 4/2011 | Todorow et al. |
| 2011/0097901 | A1 | 4/2011 | Banna et al. |
| 2011/0104884 | A1 | 5/2011 | Koshiishi et al. |
| 2013/0107415 | A1 | 5/2013 | Banna et al. |
| 2013/0154175 | A1 | 6/2013 | Todorow et al. |
| 2013/0288483 | A1 | 10/2013 | Sadjadi et al. |
| 2014/0034239 | A1 | 2/2014 | Yang et al. |
| 2014/0069584 | A1 | 3/2014 | Yang et al. |

OTHER PUBLICATIONS

International Search Report and Written Opinion dated Mar. 29, 2013 for PCT Application No. PCT/US2012/060315.
U.S. Appl. No. 62/277,299, filed Nov. 11, 2015, Luere et al.
U.S. Appl. No. 62/286,028, filed Jan. 22, 2016, Rogers.
U.S. Appl. No. 62/301,316, filed Feb. 29, 2016, Rogers.
U.S. Appl. No. 15/144,736, filed May 2, 2016, Ramaswamy et al.
Search Report received from the State Intellectual Property Office of the People's Republic of China for Chinese Patent Application No. 2012800624894 dated Oct. 16, 2015.

* cited by examiner

PROCESS KIT COMPONENTS FOR USE WITH AN EXTENDED AND INDEPENDENT RF POWERED CATHODE SUBSTRATE FOR EXTREME EDGE TUNABILITY

CROSS-REFERENCE TO RELATED APPLICATIONS

This application claims benefit of U.S. provisional patent application Ser. No. 61/576,324, filed Dec. 15, 2011 and U.S. provisional patent application Ser. No. 61/691,077, filed Aug. 20, 2012, each of which are herein incorporated by reference in their entireties.

FIELD

Embodiments of the present invention generally relate to substrate processing equipment.

BACKGROUND

Substrate processing systems, such as plasma reactors, may be used to deposit, etch, or form layers on a substrate or otherwise treat surfaces of the substrate. One technique useful for controlling aspects of such substrate processing is use of radio frequency (RF) energy to control a plasma proximate the substrate, such as by coupling RF energy to an electrode disposed beneath a substrate disposed on a substrate support.

The inventors provide herein embodiments of substrate processing systems that may provide improved RF energy control of the substrate processing system, and flexible control of plasma sheath at the vicinity of the wafer edge.

SUMMARY

Process kit components for use with a substrate support of a process chamber is provided herein. In some embodiments, a process kit ring may include a ring shaped body having an outer edge, an inner edge, a top surface and a bottom, wherein the outer edge has a diameter of about 12.473 inches to about 12.479 inches and the inner edge has a diameter of about 11.726 inches to about 11.728 inches, and wherein the ring shaped body has a height of about 0.116 to about 0.118 inches; and a plurality of protrusions disposed on the top surface of the ring shaped body, each of the plurality of protrusions disposed symmetrically about the ring shaped body.

In some embodiments, a process kit ring for use with a substrate support of a process chamber may include a ring shaped body having an outer edge, an inner edge, a top surface and a bottom, wherein the outer edge has a diameter of about 15.115 inches to about 15.125 inches and wherein the inner edge has a diameter of about 11.752 inches to about 11.757 inches, and wherein the ring shaped body has a thickness of about 0.510 inches to about 0.520 inches; a first step and a second step formed in the ring shaped body between the outer edge and inner edge, wherein the first step has an outer diameter of about 12.077 inches to about 12.087 inches, and wherein the second step has an outer diameter of about 11.884 inches to about 11.889 inches; and a ring extending downward from the bottom of the ring shaped body proximate the outer edge of the ring shaped body, the ring having an inner diameter of about 14.905 inches to about 14.915 inches.

In some embodiments, a process kit ring for use with a substrate support of a process chamber may include a ring shaped body having an outer edge, an inner edge, a top surface and a bottom, wherein the outer edge has a diameter of about 15.115 inches to about 15.125 inches and wherein the inner edge has a diameter of about 12.245 inches to about 12.250 inches, and wherein the ring shaped body has a thickness of about 0.520 inches to about 0.530 inches; a plurality of protrusions disposed symmetrically about the inner edge of the ring shaped body, the plurality of protrusions extending inwardly from the inner edge towards a center of the ring shaped body; and a ring extending downward from the bottom of the ring shaped body proximate an outer edge of the body, the ring having an inner diameter of about 14.905 inches to about 14.915 inches.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
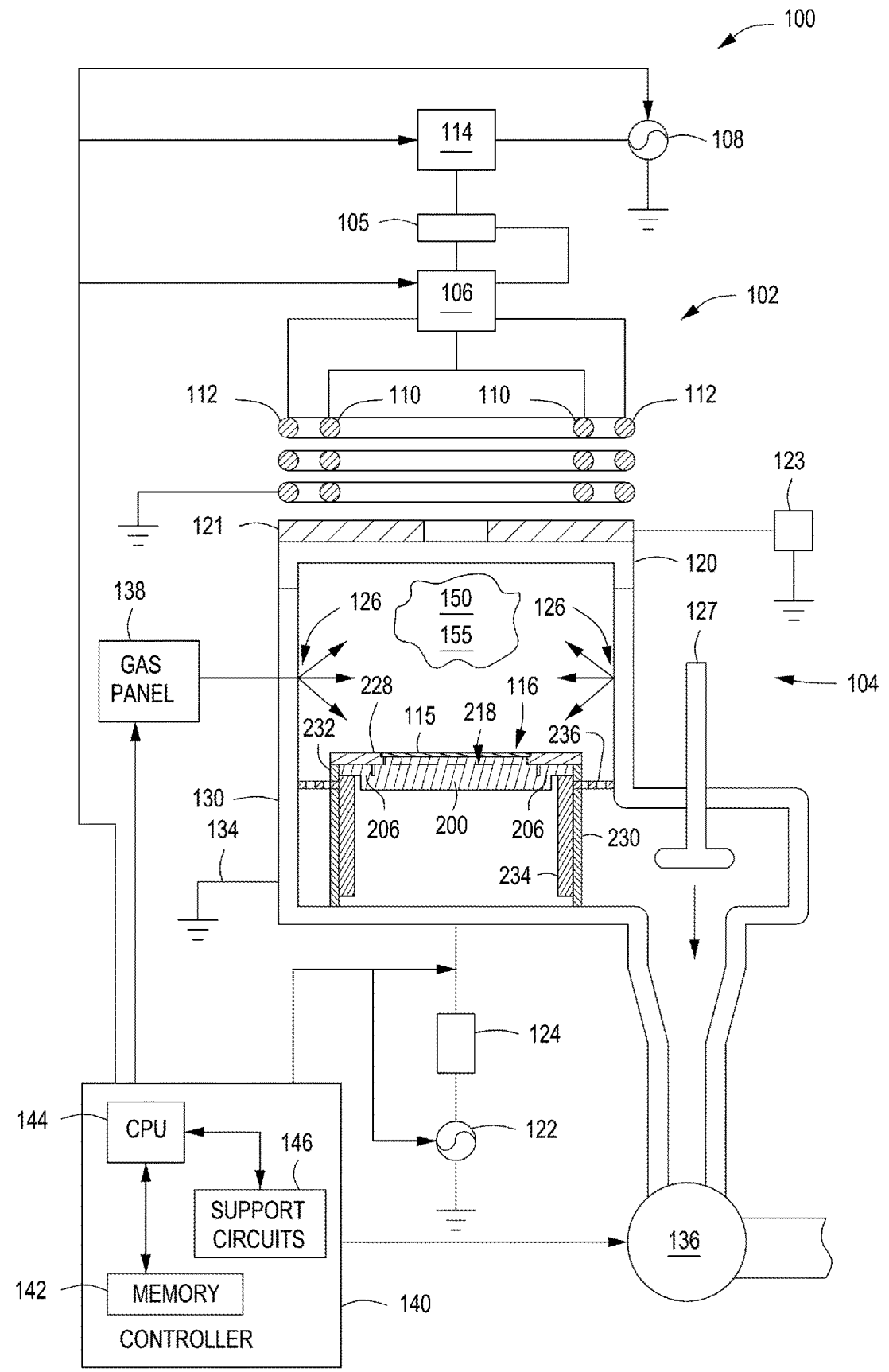
FIG. 1 depicts schematic view of a plasma reactor in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for processing substrates are disclosed herein. The inventive methods and apparatus may advantageously may facilitate more uniform plasma processing of substrates as compared to conventional plasma processing apparatus. For example, embodiments of the invention may reduce edge roll off or edge roll up at the edge of the substrate, thereby providing a more uniform substrate. The inventors have observed that edge roll off or roll up may be caused by, amongst other factors, discontinuity in RF power coupling proximate the edge of the substrate. The inventive methods and apparatus addresses discontinuity at the edge of the substrate by providing an electrode, or providing one or more additional electrodes, to improve RF power coupling proximate the edge of the substrate.

FIG. 1 depicts a schematic side view of an inductively coupled plasma reactor (reactor 100) in accordance with some embodiments of the present invention. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. For example, suitable exemplary plasma reactors that may be utilized with the inventive methods disclosed herein may be found in U.S. patent application Ser. No. 12/821,609, filed Jun. 23, 2010 by V. Todorow, et al., and entitled, "INDUCTIVELY COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY."

The reactor 100 generally includes a process chamber 104 having a conductive body (wall) 130 and a lid 120 (e.g., a ceiling) that together define an inner volume, a substrate support 116 disposed within the inner volume (shown supporting a substrate 115), an inductively coupled plasma apparatus 102, and a controller 140. The wall 130 is typically coupled to an electrical ground 134. In embodiments where the reactor 100 is configured as an inductively coupled plasma reactor, the lid 120 may comprise a dielectric material facing the inner volume of the reactor 100.

The substrate support 116 generally includes a support surface for supporting the substrate 115. The support surface may be formed from a dielectric material. In some embodiments, the substrate support 116 may include a cathode coupled through a matching network 124 to a bias power source 122. The bias source 122 may illustratively be a source of up to about 1000 W (but not limited to about 1000 W) of RF energy at a frequency of, for example, approximately 13.56 MHz, although other frequencies and powers may be provided as desired for particular applications. The bias source 122 may be capable of producing either or both of continuous or pulsed power. In some embodiments, the bias source 122 may be a DC or pulsed DC source. In some embodiments, the bias source 122 may be capable of providing multiple frequencies, or one or more second bias sources (as illustrated in FIG. 2) may be coupled to the substrate support 116 through the same matching network 124 or through one or more additional matching networks (as illustrated in FIG. 2) to provide multiple frequencies.

Figure 2:
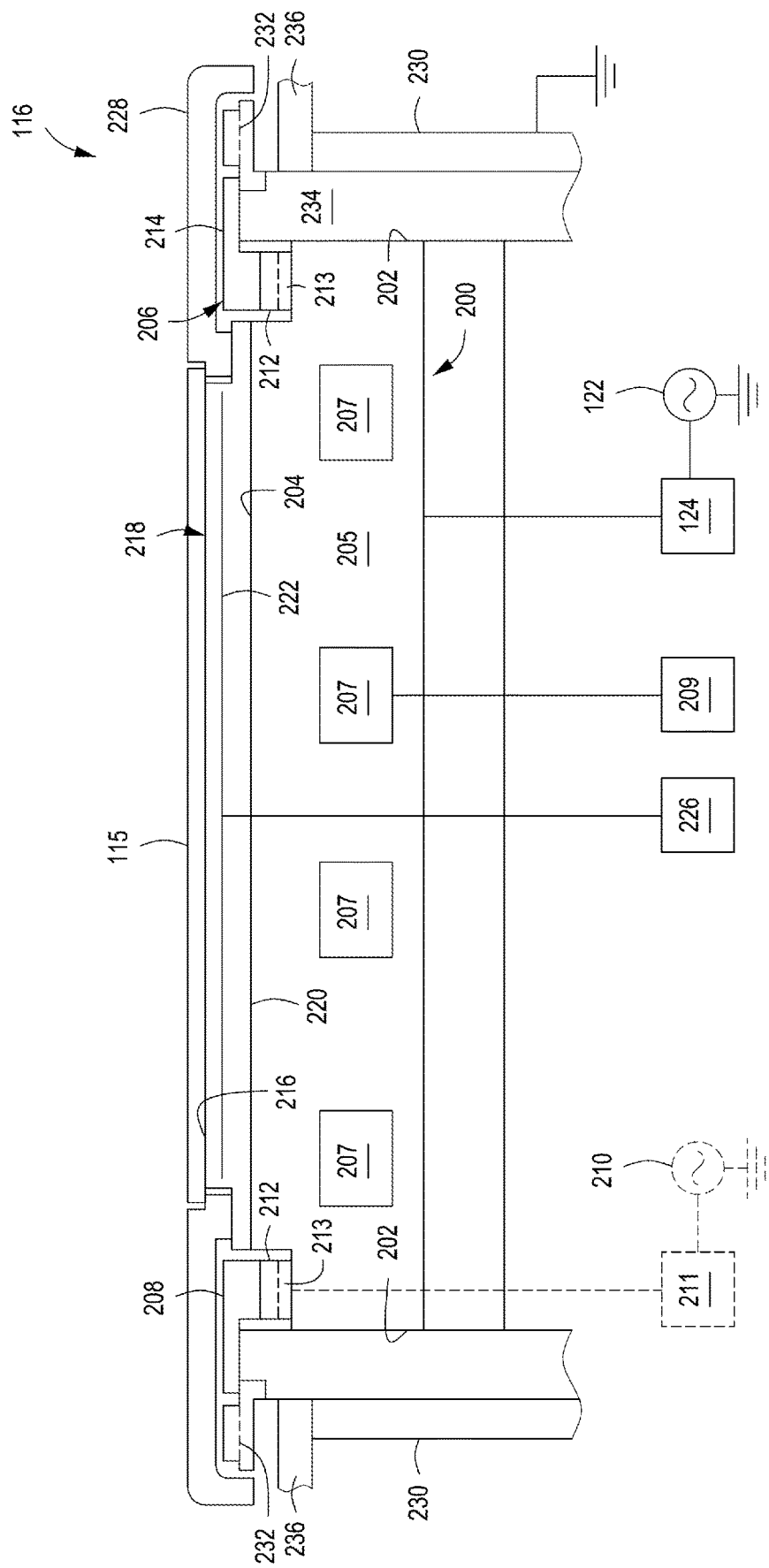
FIG. 2 depicts a schematic view of a substrate support in accordance with some embodiments of the present invention.

FIG. 2 depicts further detail of the substrate support 116 in accordance with some embodiments of the present invention. As shown in FIG. 2, the substrate support 116 may include a first electrode 200 disposed within the substrate support 116. In some embodiments, the first electrode 200 may be centrally disposed beneath the support surface 216 of the substrate support 116. The first electrode 200 may be formed of a conductive material, such as one or more of aluminum (Al), doped silicon carbide (SiC), or other suitable conductive materials that are compatible with process environment. In some embodiments, the first electrode 200 may be disposed in, or may be, a body 205 that supports the dielectric support surface of the substrate support 116. The body 205 may have a peripheral edge 202 and a first surface 204. In some embodiments, the body 205 may include a plurality of channels 207 disposed through the body 205 to flow a heat transfer medium through the channels 207. A heat transfer medium source 209 may be coupled to the plurality of channels 207 to provide a heat transfer medium to the plurality of channels 207. For example, the flow of the heat transfer medium through the plurality of channels 207 may be used to regulate the temperature of a substrate disposed on the substrate support 116.

A second electrode 206 may be disposed within the substrate support 116. The second electrode 206 may have a second surface 208 disposed about and above the first surface 204 of the first electrode 200. The second electrode 206 may extend radially from the first electrode 204, for example, such as beyond the peripheral edge 202 of the first electrode 200 as discussed below. The second electrode 206 may be formed of any suitable conductive materials, such as one or more of Al, doped SiC, doped diamond, or other suitable conductive materials that are compatible with process environment. In some embodiments, the second electrode 206 may be electrically coupled to the first electrode 200, such that the first and second electrodes 200, 206 may be coupled to a common RF power supply (e.g., bias source 122). In some embodiments, the first and second electrodes 200, 206 may be a single integrated electrode formed to a shape suitable to provide the functions taught herein. Alternatively, in some embodiments, the second electrode 206 may be electrically isolated from the first electrode 200, such that the first and second electrodes 200, 206 may be individually controlled by the same or separate RF power supplies For example, in some embodiments, the bias power source 122 (e.g., a first RF power supply) may be coupled to each of the first and second electrodes 200, 206 to provide RF energy to the first and second electrodes 200, 206. In such embodiments, the first and second electrodes 200, 206 may be electrically coupled (either as a single integrated electrode, or as separate electrodes) or may be electrically isolated. Alternatively, the bias power source 122 may be coupled to the first electrode 200 to provide RF energy to the first electrode 200 and a second power supply 210 (shown in phantom) may be coupled to the second electrode 206 via a matching network 211 (shown in phantom) to provide RF energy to the second electrode 206. For example, to electrically isolate the first and second electrodes 200, 206, a dielectric layer 213 (shown in phantom) may be disposed between the first and second electrodes 200, 206 as illustrated in FIG. 2. Alternatively, some embodiments of a base 212 (discussed below) may be used to electrically isolate the first and second electrodes 200, 206.

In some embodiments, a base 212 may be disposed on the first electrode 200. In embodiments where the first and second electrodes 200, 206 are electrically coupled, the base 212 may be a conductive ring or the like disposed about at least a portion of the first electrode 200, as illustrated in FIG.

2. Alternatively, the base 212 may have conductive pathways disposed about the first electrode 200

The base 212 may be fabricated, in whole or in part, from a dielectric material suitable to prevent arcing between the first and second electrodes 200, 206. The second electrode 206 includes a radially extending portion 214 disposed atop the base 212 that extends beyond the peripheral edge 202 of the first electrode 200. The base 212 and the radially extending portion 214 may be a single integrated component or separate components that may be assembled together to form the second electrode 206. The position of the second surface 208 of the second electrode 206 may be positioned to control the RF energy coupling proximate the periphery of a substrate disposed on the substrate support 116 during processing. In addition, the length to which the radially extending portion 214 extends beyond the peripheral edge 202 of the first electrode 200 may be adjusted to achieve the desired RF energy coupling proximate the periphery of the substrate disposed on the substrate support 116. In some embodiments, the height of the base 212 and/or the thickness of the radially extending portion 214 may together define the position of the second surface 208 with respect to the first surface 204.

The substrate support may include a substrate support surface 216 disposed above the first surface 204 of the first electrode 200. For example, the substrate support surface 216 may be part of an electrostatic chuck 218. The electrostatic chuck 218 may be disposed above the first electrode 200 and the substrate support surface 216 may be an upper surface of the electrostatic chuck 218. The electrostatic chuck 218 may include a dielectric plate, such as a ceramic puck 220, as illustrated in FIG. 2. The ceramic puck 220 may include an electrode 222 disposed therein to provide DC energy for chucking a substrate 115 to the electrostatic chuck 218. The electrode 222 may be coupled to a DC power supply 226.

Figure 3:
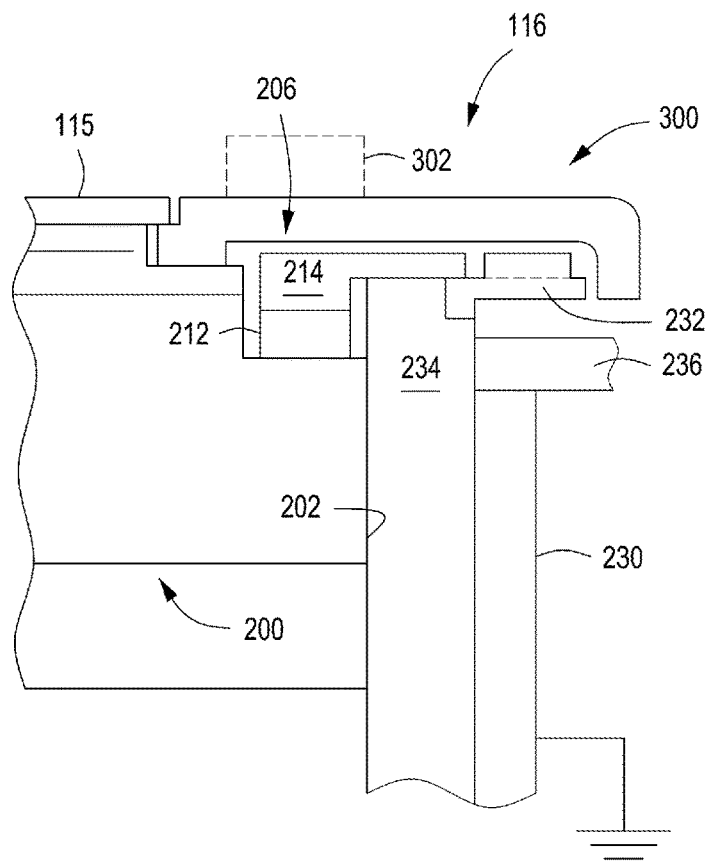
FIG. 3 depicts a partial schematic view of a substrate support in accordance with some embodiments of the present invention.

An edge ring 228 may be disposed about the electrostatic chuck 218. For example, the edge ring 228 may be a process kit, or the like, designed to improve processing proximate the peripheral edge of the substrate 224 and/or to protect the substrate support from undesired plasma exposure during processing. The edge ring 228 may be dielectric or may have an outer dielectric layer, for example, such as comprising one or more of quartz, yttria ($Y_2O_3$), aluminum nitride (AlN), diamond coated silicon carbide (SiC) or the like. In some embodiments, such as illustrated in FIG. 2, the edge ring 228 may about equal in height with a processing surface of the substrate 115 when disposed on the electrostatic chuck 218. Alternatively, the height of the edge ring relative to the processing surface of the substrate resting on the electrostatic chuck 218 may vary. For example, in some embodiments, such as illustrated in FIG. 3, an edge ring 300 may have a height that is higher that the processing surface of the substrate 115. The edge ring may be a singular piece constructed of one material, such as the edge ring 300. Alternatively, additional rings may be used to extend the height of the edge ring above the processing surface of the substrate 115, such as a ring 302 which may rest on and/or be fitted/stacked on the edge ring 300. For example, the edge ring 300 and the ring 302 may comprise the same materials. Alternatively, the edge ring 300 and the ring 302 may comprise different materials, for example, such as the edge ring 300 may comprise quartz and the ring 302 may comprise SiC. The height of the edge ring (e.g., edge ring 300 or a combination of edge ring 300 and ring 302) above the processing surface of the substrate 115 may be optimized to improve uniformity of the plasma proximate the peripheral edge of the substrate 115.

Returning to FIG. 2, the edge ring 228 may be disposed above and adjacent to the radially extending portion 214 of the second electrode 206 such that the edge ring 228 may be disposed between the extending portion 214 and a grounding layer 230. For example, the edge ring 228 may be formed of a singular piece such that the edge ring 228 separates the extending portion 214 from the grounding layer 230. Alternatively, as illustrated in FIG. 2, a ring 232, such as a dielectric spacer or the like may be disposed below the edge ring 228 and between the extending portion 214 of the second electrode 206 and the grounding layer 230. In either embodiment, i.e., with or without the ring 232, it may be desired to have the extending portion 214 sufficiently isolated from the grounding layer 230 such that arcing between the extending portion 214 and the grounding layer 230 is limited and/or prevented.

Figure 4:
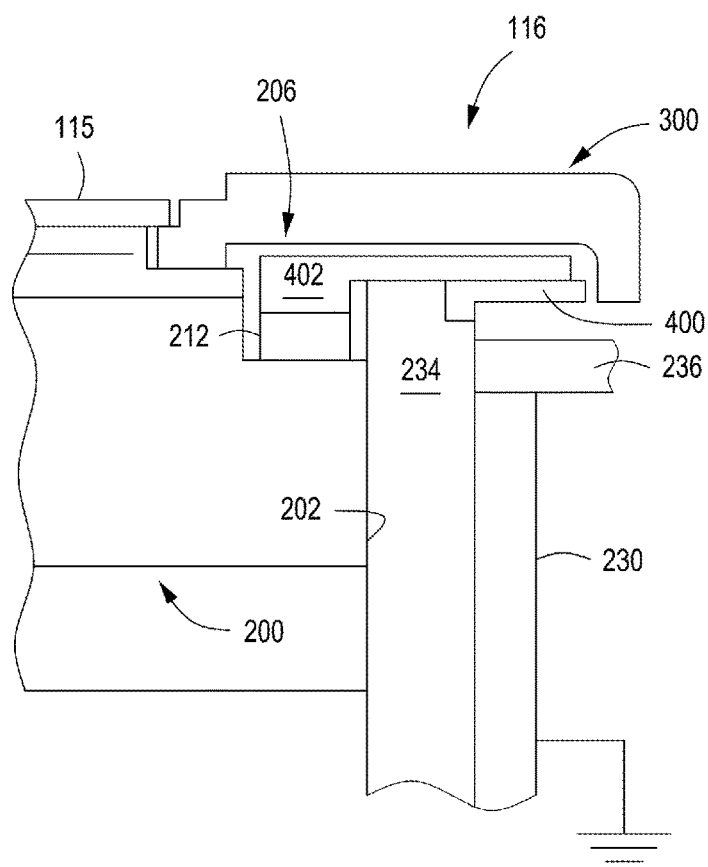
FIG. 4 depicts a partial schematic view of a substrate support in accordance with some embodiments of the present invention.

The ring 232 may be a singular piece or comprise multiple pieces stacked or interconnected together as illustrated by the dotted line in FIG. 2. In embodiments where multiple stacked pieces are used, the piece may comprise the same or different materials. In some embodiments, other rings may be utilized or one or more pieces may be removed to accommodate a larger extending portion of the second electrode 206. As illustrated in FIG. 4, a ring 400 may be utilized to accommodate a larger extending portion 402 (e.g., larger than the extending portion 214). As illustrated, the extending portion 402 may extend beyond a first dielectric layer 234 (discussed below). Similar to the ring 232, the ring 400 may be utilized to sufficiently isolate the extending portion 402 from the grounding layer 230. The extending portion (e.g., 214 or 402) may range in length, for example, to optimize uniformity in the plasma proximate the peripheral edge of the substrate 115. In some embodiments, the length of the extending portion and the height of the edge ring may both be optimized to achieve the desired uniformity in the plasma proximate the peripheral edge of the substrate 115.

Figure 5A:
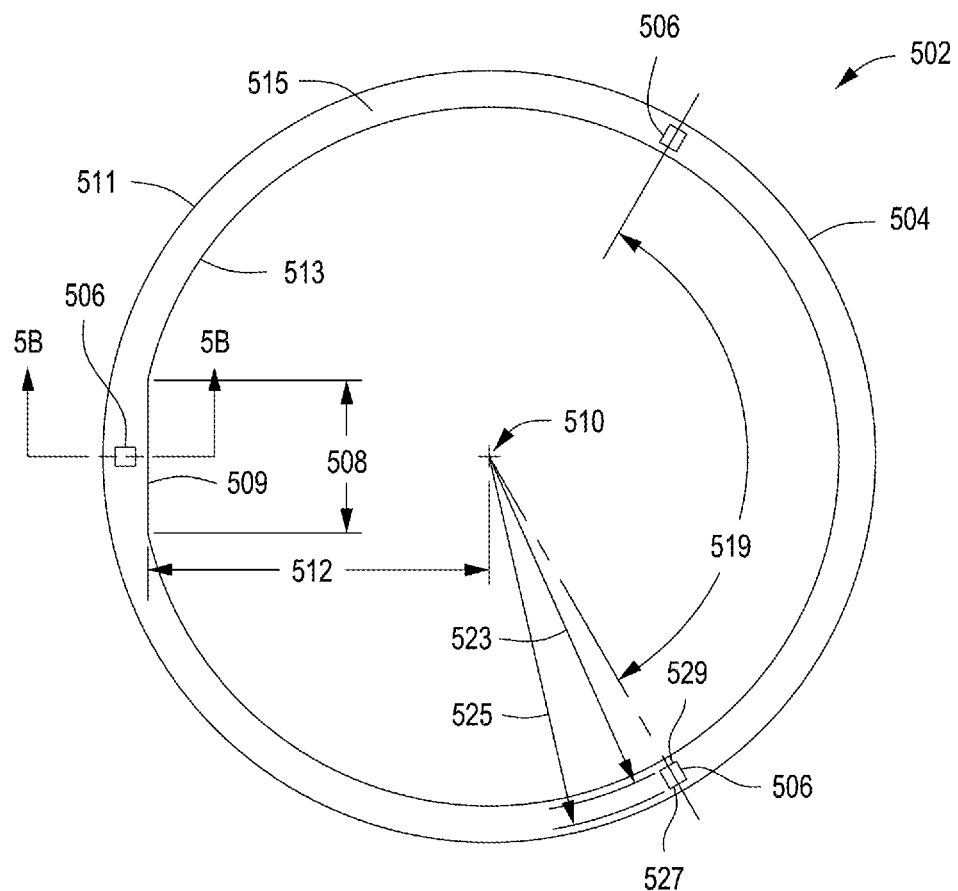
FIGS. 5A-B respectively depict a top view and a side cross-sectional view of a process kit ring for use in a plasma reactor in accordance with some embodiments of the present invention.
Figure 5B:
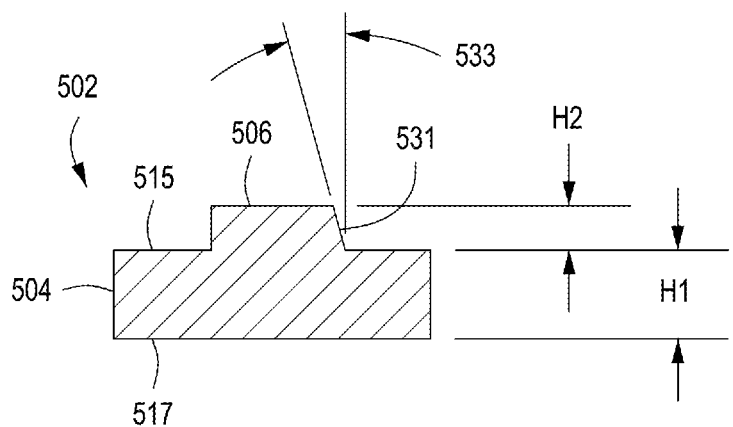

FIGS. 5A-B respectively depict a top view and a side cross-sectional view of a ring 502 that may be used as the ring 232 or the ring 400 in accordance with some embodiments of the present invention. The dimensions of the ring 502 described below advantageously allow the ring 502 to be suitable for use with the substrate support 116 described above. In some embodiments, the ring 502 is fabricated from silicon carbide (SiC). By fabricating the ring 502 from silicon carbide the ring 502 may advantageously be resistant to degradation when exposed to a process environment within the process chamber.

In some embodiments, the ring 502 may generally comprise a ring shaped body 504 having an outer edge 511, inner edge 513, a top surface 515, and a bottom surface 517. In some embodiments, the body 504 may comprise a plurality of protrusions 506 (three protrusions 506 shown) extending upwardly from the top surface 515.

In some embodiments, a diameter of the outer edge 511 may be about 12.473 inches to about 12.479 inches. In some embodiments, a diameter of the inner edge 513 may be about 11.726 inches to about 11.728 inches. In some embodiments, the inner edge 513 of the ring 502 comprises a flat portion 509 proximate one of the plurality of protrusions 506. The flat portion 509 interfaces with a portion of the substrate support to facilitate proper orientation of the ring 502 when installed on the substrate support. In some embodiments, a distance 512 from the flat portion 509 to a center 510 of the ring 502 may be about 5.826 inches to about 5.831 inches. In some embodiments, the flat portion 509 may have a length 508 of about 1.310 inches to about 1.320 inches.

When present, the plurality of protrusions 506 (three protrusions 506 shown) support a component of a substrate support (e.g., the edge ring 228 of substrate support 116 described above) atop the ring 502 and provide a gap therebetween. In embodiments where three protrusions 506 are present, the protrusions 506 may be disposed symmetrically about the body 504. For example, each of the three protrusions 506 may be separated by an angle 519 of about 120 degrees from one another about the body 504. In addition, each protrusion 506 may be disposed about the body 504 such a distance 525 between an outer edge 527 of the protrusion 506 and the center 510 of the body 504 is about 6.995 inches to about 6.105 inches. In some embodiments a distance 523 from an inner edge 529 of the protrusion 506 to the center 510 of the body 504 is about 5.937 inches to about 5.947 inches.

Referring to FIG. 5B, in some embodiments, the body 504 may have a height H1 of about 0.116 inches to about 0.118 inches. The protrusion 506 may extend from the surface 515 of the body 504 to a height H2 of about 0.049 inches to about 0.059 inches. In some embodiments, the protrusion 506 may have a sloped side 531 that is angled about 9 degrees to about 11 degrees from an axis 533 perpendicular to the surface 515 of the body 504.

Figure 6A:
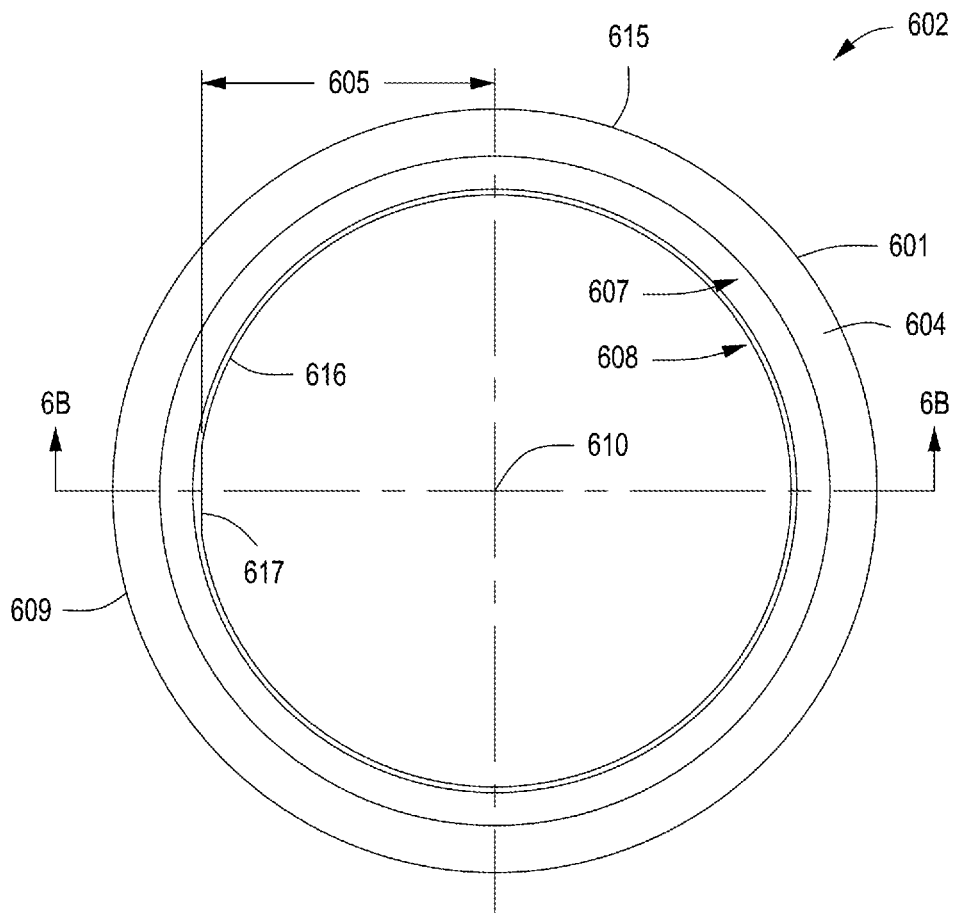
FIGS. 6A-C respectively depict a top view, a side cross-sectional view, and a detail of the side cross-sectional view of a process kit ring for use in a plasma reactor in accordance with some embodiments of the present invention.
Figure 6B:
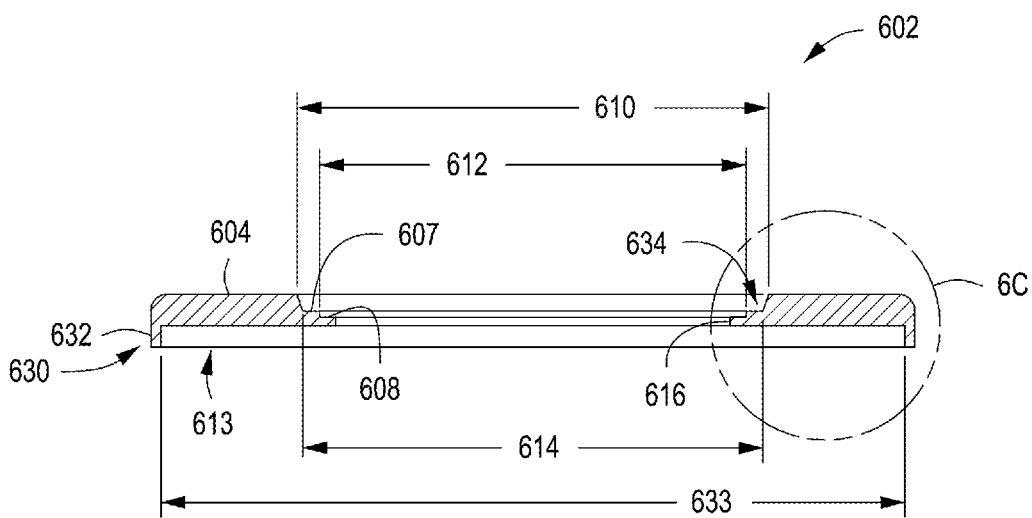
Figure 6C:
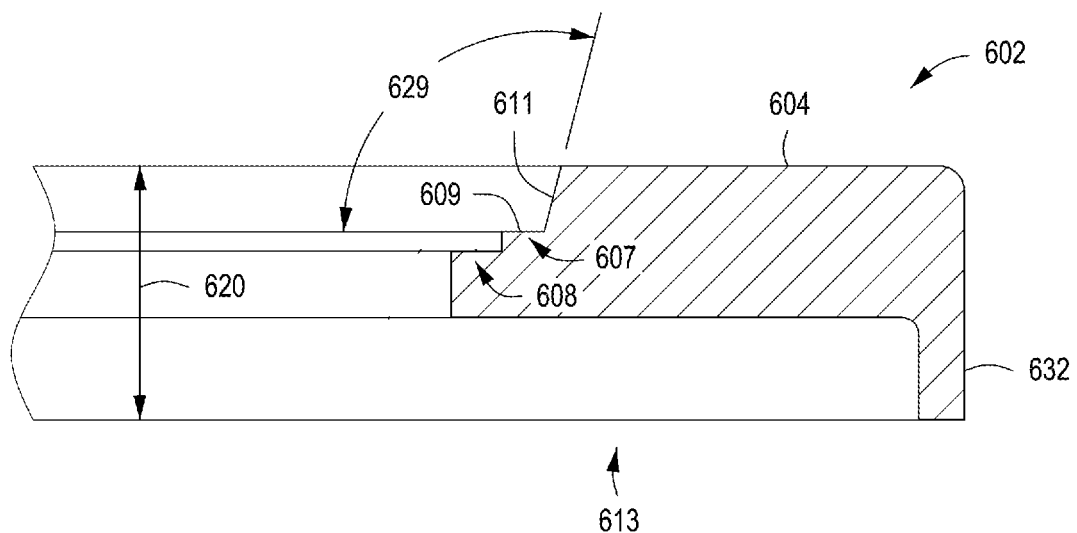

FIGS. 6A-C respectively depict a top view, a side cross-sectional view, and a detail of the side cross-sectional view of a process kit ring 602 that may be used as the edge ring 228 or the edge ring 300 for use in a plasma reactor in accordance with some embodiments of the present invention. The dimensions of the process kit ring 602 described below advantageously allow the process kit ring 602 to be suitable for use with the substrate support 116 described above. In some embodiments, the process kit ring 602 is fabricated from quartz (SiO$_2$). By fabricating the process kit ring 602 from quartz, the process kit ring 602 may advantageously be dielectric and resistant to degradation when exposed to a process environment within the process chamber.

The process kit ring 602 generally comprises a ring shaped body 601 having an outer edge 615, inner edge 616, a top surface 604 and a bottom 613. A first step 607 and second step 608 may be formed between the outer edge 615 and the inner edge 616.

In some embodiments, a diameter of the outer edge 615 may be about 15.115 inches to about 15.125 inches. In some embodiments, a diameter of the inner edge 616 may be about 11.752 inches to about 11.757 inches. In some embodiments, the inner edge 616 of the body 601 comprises a flat portion 617 configured to interface with a portion of the substrate support to facilitate proper orientation of the process kit ring 602 when installed on the substrate support. In some embodiments, a distance 605 between the flat portion 617 and a center axis of the process kit ring 602 may be about 5.825 to about 5.830 inches.

Referring to FIG. 6B, the first step 607 provides an open area 634 above and about the periphery of a substrate when disposed on the process kit ring 602 for processing. The open area 634 may allow for processing and/or may reduce an amount of heat transfer from the substrate to the process kit ring 602. In some embodiments, the first step 607 may have an outer diameter 614 of about 12.077 inches to about 12.087 inches and extend to the outer diameter 612 of the second step 608. In some embodiments, a transition 611 from a surface 609 of the second step 608 to the top surface 604 of the process kit ring 602 may have an angle 629 of about 99 degrees to about 101 degrees, such as shown in FIG. 6C. Referring back to FIG. 6B, in such embodiments, an inner diameter 610 of the top surface 604 may be about 12.132 inches to about 12.142 inches.

The second step 608 provides a supporting surface for a substrate when disposed on the process kit ring 602 for processing. The second step 608 may have an outer diameter 612 of about 11.884 inches to about 11.889 inches and extend to the inner edge 616 of the process kit ring 602.

In some embodiments, the process kit ring 602 may comprise a ring 632 extending downward from the bottom 613 of the process kit ring 602 and about an outer edge 630 of the process kit ring 602. The ring 632 allows the process kit ring 602 to securely sit atop the substrate support and allow other components of the substrate support to fit underneath the process kit ring 602 (e.g., the ring 502 described above). In some embodiments, the ring 632 may have an inner diameter 633 of about 14.905 inches to about 14.915 inches. Referring to FIG. 6C, in some embodiments, an overall thickness 620 of the process kit ring 602 may be about 0.510 inches to about 0.520 inches.

FIGS. 7A-E respectively depict a top view, a side cross-sectional view, a detail of the side cross-sectional view, a detail of the top view, and a side cross sectional view of the top detail of a process kit ring for use in a a plasma reactor in accordance with some embodiments of the present invention. The dimensions of the process kit ring 702 described below advantageously allow the process kit ring 702 to be suitable for use with the substrate support 116 described above. In some embodiments, the process kit ring 702 is fabricated from quartz (SiO$_2$). By fabricating the process kit ring 702 from quartz, the process kit ring 702 may advantageously be dielectric and resistant to degradation when exposed to a process environment within the process chamber.

The process kit ring 702 generally comprises a ring shaped body 704 having an outer edge 705, inner edge 706, a top surface 707 and a bottom 709 and a plurality of protrusions (three protrusions 716 shown) extending inwardly from the inner edge 706 towards a center 711 of the process kit ring 702.

In some embodiments, a diameter 708 of the outer edge 705 may be about 15.115 inches to about 15.125 inches. In some embodiments, a diameter of the inner edge 706 may be about 12.245 inches to about 12.250 inches.

The plurality of protrusions 716 provides a supporting surface for a substrate when disposed on the process kit ring 702 for processing. In some embodiments, the plurality of protrusions 716 may be disposed symmetrically about the inner edge 706 of the process kit ring 702, for example such as disposed about 120 degrees from one another. In some embodiments, each of the plurality of protrusions 716 extend towards the center 711 of the process kit ring 702 such that a distance 710 from the center 711 to an end 719 of each of the plurality of protrusions 716 may be about 5.937 inches to about 5.947 inches.

Figure 7A:
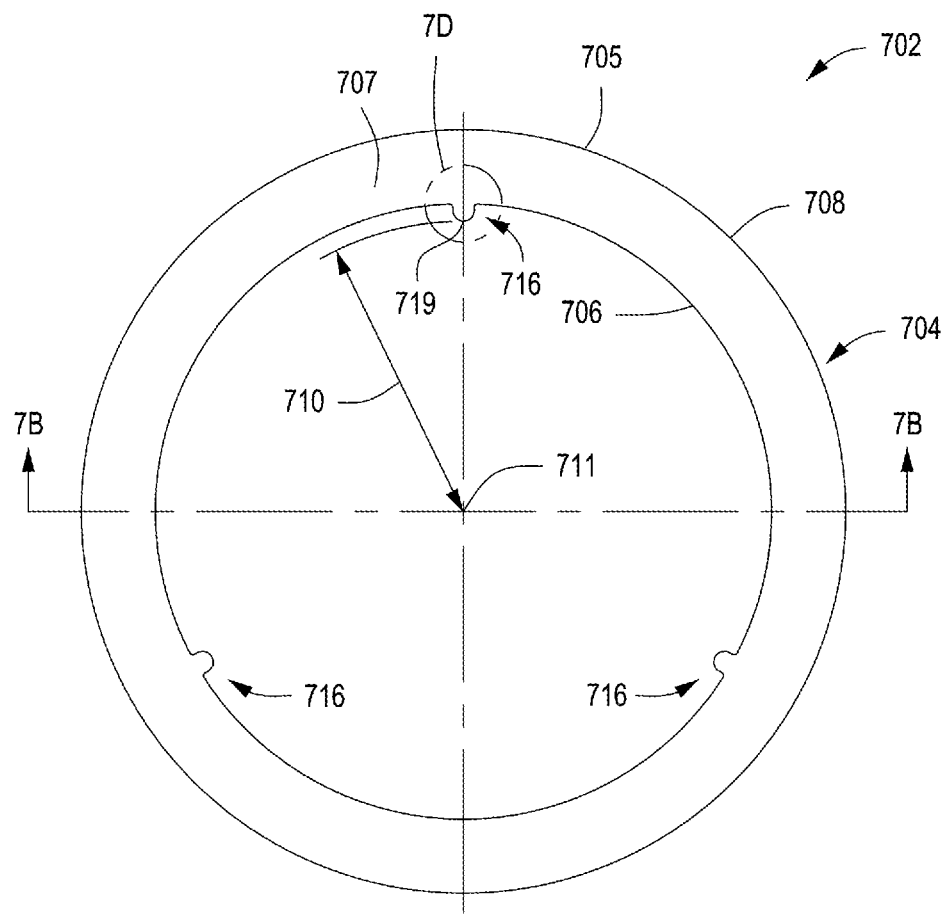
FIGS. 7A-E respectively depict a top view, a side cross-sectional view, a detail of the side cross-sectional view, a detail of the top view, and a side cross sectional view of the top detail of a process kit ring for use in a a plasma reactor in accordance with some embodiments of the present invention.
Figure 7B:
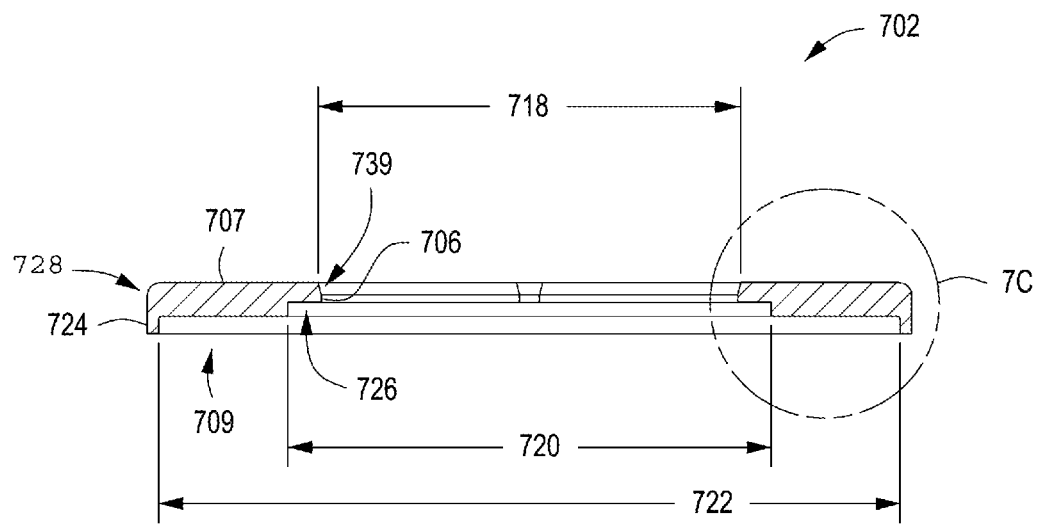
Figure 7C:
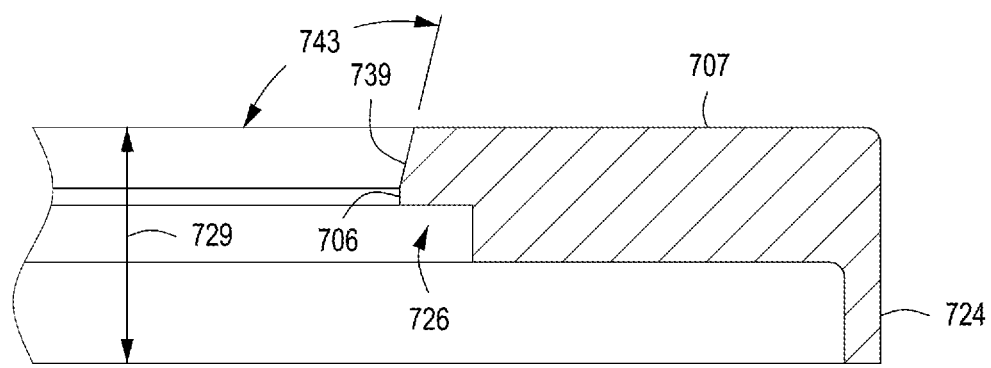
Figure 7D:
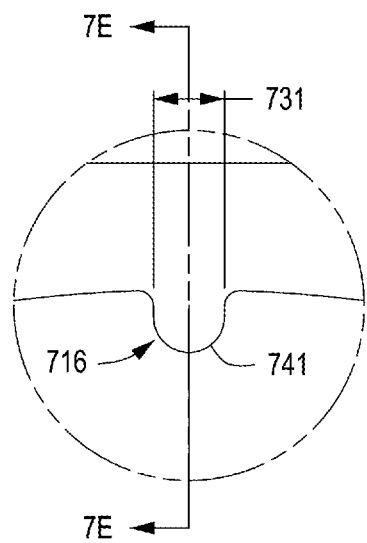
Figure 7E:
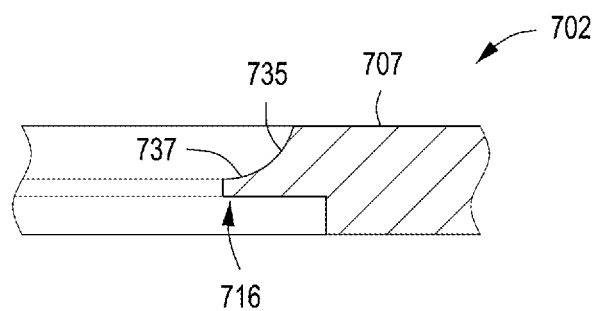

Referring to FIG. 7D, in some embodiments, each of the plurality of protrusions 716 may have a width 731 of about 0.205 inches to about 0.216 inches. In some embodiments, each of the plurality of protrusions 716 may comprise a rounded end 741.

Referring to 7E, in some embodiments, a substrate supporting surface 737 of each of the plurality of protrusions 716 may be disposed beneath the top surface 707 of the process kit ring 702. In some embodiments, a transition 735 between the substrate supporting surface 737 and the top surface 707 of the process kit ring 702 may be curved.

Referring to FIG. 7B, in some embodiments, a notch 726 may be formed beneath the inner edge 706. When present, the notch 726 may interface with another component of the substrate support to facilitate centering the process kit ring 702 on the component. In some embodiments, the notch 726 may be formed in the process kit ring 702 to a diameter 720 of about 12.405 inches to about 12.505 inches. In some embodiments, the process kit ring 702 may comprise a ring 724 extending downward from the bottom 709 of the process kit ring 702 about an outer edge 726 of the process kit ring 702. The ring 724 allows the process kit ring 702 to securely sit atop the substrate support and allow other components of the substrate support to fit underneath the process kit ring 702 (e.g., the ring 502 described above). In some embodiments, an inner diameter 722 of the ring 724 may be about 14.905 inches to about 14.915 inches. In some embodiments, the inner edge 706 may comprise a tapered portion 739 extending from the inner edge 706 to the top surface 707 thereby providing an inner diameter 718 of about 12.295 inches to about 12.305 inches proximate the top surface 707 of the process kit ring 702. Referring to FIG. 7C, in such embodiments, an angle 743 between the tapered portion 735 and the surface may be about 99 degrees to about 101 degrees. In some embodiments, an overall thickness 729 of the process kit ring 702 may be about 0.520 inches to about 0.530 inches.

Returning to FIG. 2, the ring 232 (or ring 400) may rest on a first dielectric layer 234. The first dielectric layer 234 may be disposed about the peripheral edge 202 of the first electrode 200. For example, the first dielectric layer 234 may electrically isolate the first electrode 200 and/or at least a portion of the second electrode 206 from the grounding layer 230. As illustrated, the grounding layer 230 may be disposed about the first dielectric layer 234. In some embodiments, the radially extending portion 214 of the second electrode 206 may be at least partially disposed above the first dielectric layer 234, as illustrated in FIG. 2. The first dielectric layer 234 may comprise any suitable dielectric materials, such as one or more of quartz, yittria (Y₂O₃), silicon carbide (SiC), diamond coated quartz, or the like. The grounding layer 230 may comprise any suitable conductive material, such as one or more of aluminum, doped SiC, doped diamond, or other suitable conductive materials that are compatible with process environment. As illustrated in FIGS. 1 and 2, the ground layer 230 may be coupled to a plasma shield 236 which may be disposed about the substrate support 116, for example, about the first dielectric layer 234.

Returning to FIG. 1, in some embodiments, the lid 120 may be substantially flat. Other modifications of the chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the lid 120. The relative position, ratio of diameters of each coil, and/or the number of turns in each coil can each be adjusted as desired to control, for example, the profile or density of the plasma being formed via controlling the inductance on each coil. Each of the first and second coils 110, 112 is coupled through a matching network 114 via the RF feed structure 106, to the RF power supply 108. The RF power supply 108 may illustratively be capable of producing up to about 4000 W (but not limited to about 4000 W) at a tunable frequency in a range from 50 kHz to 13.56 MHz, although other frequencies and powers may be provided as desired for particular applications.

In some embodiments, a power divider 105, such as a dividing capacitor, may be provided between the RF feed structure 106 and the RF power supply 108 to control the relative quantity of RF power provided to the respective first and second coils. For example, as shown in FIG. 1, the power divider 105 may be disposed in the line coupling the RF feed structure 106 to the RF power supply 108 for controlling the amount of RF power provided to each coil (thereby facilitating control of plasma characteristics in zones corresponding to the first and second coils). In some embodiments, the power divider 105 may be incorporated into the match network 114. In some embodiments, after the power divider 105, RF current flows to the RF feed structure 106 where it is distributed to the first and second RF coils 110, 112. Alternatively, the split RF current may be fed directly to each of the respective first and second RF coils.

A heater element 121 may be disposed atop the lid 120 to facilitate heating the interior of the process chamber 104. The heater element 121 may be disposed between the lid 120 and the first and second coils 110, 112. In some embodiments. the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thereby facilitating uniform plasma formation within the process chamber 104.

During operation, the substrate 115 (such as a semiconductor wafer or other substrate suitable for plasma processing) may be placed on the substrate support 116 and process gases may be supplied from a gas panel 138 through entry ports 126 to form a gaseous mixture 150 within the process chamber 104. For example, prior to introduction of the process gases, a temperature of surfaces within the chamber may be controlled, for example, by the heater 121 as discussed above to have inner volume facing surfaces at a temperature of between about 100 to 200 degrees Celsius, or about 150 degrees Celsius. The gaseous mixture 150 may be ignited into a plasma 155 in the process chamber 104 by applying power from the plasma source 108 to the first and second coils 110, 112. In some embodiments, power from the bias source 122 may be also provided to the substrate support 116. The pressure within the interior of the chamber 104 may be controlled using a throttle valve 127 and a vacuum pump 136. The temperature of the chamber wall 130 may be controlled using liquid-containing conduits (not shown) that run through the wall 130.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The memory 142 stores software (source or object code) that may be executed or invoked to control the operation of the reactor 100 in the manner described herein. The software routine may also be stored and/or executed by a second CPU (not shown) that is remotely located from the hardware being controlled by the CPU 144.

While the foregoing is directed to embodiments of the present invention, other and further embodiments of the invention may be devised without departing from the basic scope thereof.

The invention claimed is:

1. A process kit ring for use with a substrate support of a process chamber, comprising:
a ring shaped body having an outer edge, an inner edge, a top surface and a bottom forming a rectangular cross section, wherein the outer edge has a diameter of about 12.473 inches to about 12.479 inches and the inner edge has a diameter of about 11.726 inches to about 11.728 inches, and wherein the ring shaped body has a thickness of about 0.116 to about 0.118 inches; and
a plurality of protrusions disposed on the top surface of the ring shaped body and configured to support an edge ring atop of the plurality of protrusions, each of the plurality of protrusions disposed symmetrically about the ring shaped body, wherein each of the plurality of protrusions has a height of about 0.049 inches to about 0.059 inches above the top surface of the ring shaped body.

2. The process kit ring of claim 1, wherein the plurality of protrusions consist of three protrusions, and wherein the three protrusions are disposed about 120 degrees from one another about the ring shaped body.

3. The process kit ring of claim 1, wherein each of the plurality of protrusions comprises a sloped side, wherein the sloped side is angled about 9 degrees to about 11 degrees from an axis that is perpendicular to the top surface of the ring shaped body.

4. The process kit ring of claim 1, wherein the ring is fabricated from silicon carbide (SiC).

5. The process kit ring of claim 1, wherein the inner edge comprises a flat portion extending from the top surface to the bottom and disposed proximate one of the plurality of protrusions, the flat portion having a length of about 1.310 inches to about 1.320 inches.

6. The process kit ring of claim 1, wherein a distance between a center of the ring shaped body and an outer edge of each of the plurality of protrusions is about 6.995 inches to about 6.105 inches, and wherein a distance between the center of the ring shaped body and an inner edge of each of the plurality of protrusions is about 5.937 inches to about 5.947.

7. A process kit ring for use with a substrate support of a process chamber, comprising:
a ring shaped body having an outer edge, an inner edge, a top surface and a bottom forming a rectangular cross section, wherein the outer edge has a diameter of about 12.473 inches to about 12.479 inches and the inner edge has a diameter of about 11.726 inches to about 11.728 inches, and wherein the ring shaped body has a thickness of about 0.116 to about 0.118 inches; and
three protrusions disposed about 120 degrees from one another on the top surface of the ring shaped body and configured to support an edge ring atop of the three protrusions, each of the three protrusions disposed symmetrically about the ring shaped body, wherein each of the three protrusions has a height of about 0.049 inches to about 0.059 inches above the top surface of the ring shaped body.

8. The process kit ring of claim 7, wherein each of the three protrusions comprises a sloped side, wherein the sloped side is angled about 9 degrees to about 11 degrees from an axis that is perpendicular to the top surface of the ring shaped body.

9. The process kit ring of claim 7, wherein the ring is fabricated from silicon carbide (SiC).

10. The process kit ring of claim 7, wherein the inner edge comprises a flat portion extending from the top surface to the bottom and disposed proximate one of the three protrusions, the flat portion having a length of about 1.310 inches to about 1.320 inches.

11. The process kit ring of claim 7, wherein a distance between a center of the ring shaped body and an outer edge of each of the three protrusions is about 6.995 inches to about 6.105 inches, and wherein a distance between the center of the ring shaped body and an inner edge of each of the three protrusions is about 5.937 inches to about 5.947.

12. A process kit ring for use with a substrate support of a process chamber, comprising:
a ring shaped body having an outer edge, an inner edge, a top surface and a bottom forming a rectangular cross section, wherein the outer edge has a diameter of about 12.473 inches to about 12.479 inches and the inner edge has a diameter of about 11.726 inches to about 11.728 inches, and wherein the ring shaped body has a thickness of about 0.116 to about 0.118 inches; and
a plurality of protrusions disposed on the top surface of the ring shaped body and configured to support an edge ring atop of the plurality of protrusions, each of the plurality of protrusions disposed symmetrically about the ring shaped body, wherein each of the plurality of protrusions has a height of about 0.049 inches to about 0.059 inches above the top surface of the ring shaped body,
wherein a distance between a center of the ring shaped body and an outer edge of each of the plurality of protrusions is about 6.995 inches to about 6.105 inches, and wherein a distance between the center of the ring shaped body and an inner edge of each of the plurality of protrusions is about 5.937 inches to about 5.947.

13. The process kit ring of claim 12, wherein the plurality of protrusions consist of three protrusions, and wherein the three protrusions are disposed about 120 degrees from one another about the ring shaped body.

14. The process kit ring of claim 12, wherein each of the plurality of protrusions comprises a sloped side, wherein the sloped side is angled about 9 degrees to about 11 degrees from an axis that is perpendicular to the top surface of the ring shaped body.

15. The process kit ring of claim 12, wherein the ring is fabricated from silicon carbide (SiC).

16. The process kit ring of claim 12, wherein the inner edge comprises a flat portion extending from the top surface to the bottom and disposed proximate one of the plurality of protrusions, the flat portion having a length of about 1.310 inches to about 1.320 inches.

* * * * *